(12) United States Patent
Kuo et al.

(10) Patent No.: US 6,712,265 B2
(45) Date of Patent: Mar. 30, 2004

(54) SYSTEM AND METHOD FOR INTERLOCKING MANAGEMENT IN SEMICONDUCTOR MATERIAL SUPPLY EQUIPMENT

(75) Inventors: Hsin-Yu Kuo, Chia-I (TW); Dah-Woei Lee, Tainan (TW); Fu-Chin Yeh, Hsin-Chu (TW); Yueh-Feng Wu, Taichung (TW); Chun-Sheng Pang, Hsin-Chu (TW)

(73) Assignee: United Microelectronics, Corp., Hsin-chu (TW)

( * ) Notice: Subject to any disclaimer, the term of this patent is extended or adjusted under 35 U.S.C. 154(b) by 22 days.

(21) Appl. No.: 09/916,270

(22) Filed: Jul. 30, 2001

(65) Prior Publication Data

US 2003/0019922 A1 Jan. 30, 2003

(51) Int. Cl.$^7$ .............................................. G06F 17/00
(52) U.S. Cl. ....................... 235/375; 235/383; 235/385; 235/454; 235/462.01; 235/462.46; 235/472.02
(58) Field of Search ................................ 235/375, 383, 235/384, 385, 454, 462.01, 472, 462.46

(56) References Cited

U.S. PATENT DOCUMENTS 5,334,826 A * 8/1994 Sato et al. .............. 235/462.06
5,537,313 A * 7/1996 Pirelli ......................... 705/28
5,602,380 A * 2/1997 Bishay ................... 235/462.46
5,810,928 A * 9/1998 Harada et al. .............. 118/690
5,945,660 A * 8/1999 Nakasuji et al. ........ 235/462.46
5,979,756 A * 11/1999 Ahn et al. .................. 235/383
6,422,465 B2 * 7/2002 Miller ........................ 235/384
6,468,424 B1 * 10/2002 Donig et al. ................ 210/232

* cited by examiner

Primary Examiner—Michael G. Lee
Assistant Examiner—Steven S. Paik

(57) ABSTRACT

In the present invention, a system for interlocking material supply equipment in semiconductor manufacture management system comprises collecting means for collecting a user's identification and content identification of material supply equipment. Communication means is for transferring the user's identification and the content identification. A controller is communicated with the material supply equipment and the collecting means through the communication means. Alarm means is coupled to the material supply equipment and communicated with the controller. A method for interlocking managing change materials of material supply equipment comprises collecting a changed material information in an material supply equipment. The changed material information is checked by a controller communicated with the material supply equipment. An alarm message is transferred to the material supply equipment from the controller. The corresponding material supply equipment is disabled according to said alarm message.

22 Claims, 8 Drawing Sheets

SYSTEM AND METHOD FOR INTERLOCKING MANAGEMENT IN SEMICONDUCTOR MATERIAL SUPPLY EQUIPMENT

BACKGROUND OF THE INVENTION

1. Field of the Invention

The invention relates to a system and method for semiconductor material supply equipment, and more particularly to a system and method for interlocking management for changed material of material supply equipment.

2. Description of the Prior Art

It is known to provide a semiconductor manufacture system with controllers which control various processing steps within the semiconductor manufacture system. For example, material supply equipment system is shown in FIG. 1. In general, in a semiconductor material supply equipment management system 105, a monitor system 111, for example a computer, is coupled to material supply equipment system 114 including many material supply equipment, such as gas supply and chemical supply cylinders or tanks. Conventionally, a user can monitor the whole condition of the semiconductor material supply equipment management system 105 with the monitor system 111, such as volume of gas, flow amount of chemical, and so on.

On the other hand, the monitor system 111 of the semiconductor factory also can be coupled to a procurement and material management system 118 for checking material statistics. However, accidental failure, for example changing wrong material into material supply equipment, happens in the semiconductor factory, that further results in consequently serious problems, such as products scrapped. Furthermore, wrong changing material may damage those operators and the expensive semiconductor manufacture equipment. Furthermore, the changing material records and statistics can't be traced in case of abnormal condition happening. On the other hand, the changing material records and statistics can't be automatically established for comparison with original procurement record and statistics.

SUMMARY OF THE INVENTION

It is an object of the present invention to provide a system and method for interlocking management for material supply equipment in semiconductor manufacture management system. Changing material records and statistics can be retrieved and saved in a control and monitor integrated system.

It is another object of the present invention to provide apparatus and method for interlocking material supply equipment in semiconductor factory. The control and monitor integrated system can check the changing material records and statistics, and further detects abnormal condition of changing steps.

It is a further object of the present invention to provide a system and method for interlocking management in the semiconductor material supply equipment system. The control and monitor integrated system can transfer alarm message to material supply equipment and further disable the function of the material supply equipment.

In the present invention, apparatus for interlocking equipment material supply in semiconductor manufacture management system comprises a controller; a bar-code scanner communicating with the controller through a transmission system. The bar-code scanner is for collecting a plurality of bar-code information of the material supply equipment. A plurality of alarm devices are coupled to a plurality of material supply equipment and the controller, that is for receiving a plurality of alarm message from the controller. A method for interlock managing change materials of material supply equipment in semiconductor manufacture management system comprises collecting a changed material information in an material supply equipment. The changed material information is checked by a controller communicated with the material supply equipment. An alarm message is transferred to the material supply equipment from the controller. The corresponding material supply equipment is disabled according to said alarm message.

BRIEF DESCRIPTION OF THE DRAWINGS

A better understanding of the invention may be derived by reading the following detailed description with reference to the accompanying drawing wherein.

DESCRIPTION OF THE PREFERRED EMBODIMENT

While the invention is described in terms of a single preferred embodiment, those skilled in the art will recognize that many steps described below can be altered without departing from the spirit and scope of the invention.

In the present invention, a system for interlocking material supply equipment in semiconductor manufacture management system comprises collecting means for collecting a user's identification and content identification of material supply equipment. Communication means is for transferring the user's identification and the content identification. A controller is communicated with the material supply equipment and the collecting means through the communication means. The controller is for transferring a plurality of alarm message. Alarm means is coupled to the material supply equipment and communicated with the controller through the communication means. The alarm means is for displaying and controlling the material supply equipment. A method for interlock managing change materials of material supply equipment in semiconductor manufacture management system comprises collecting a changed material information in an material supply equipment. The changed material information is checked by a controller communicated with the material supply equipment. An alarm message is transferred to the material supply equipment from the controller. The corresponding material supply equipment is disabled according to said alarm message.

Figure 1:
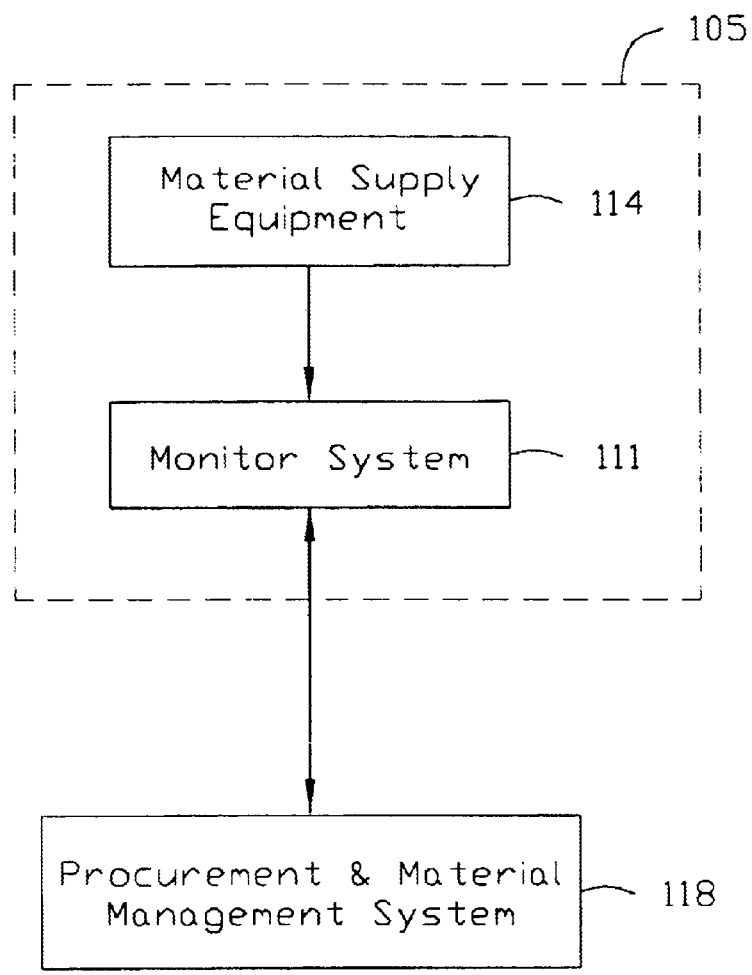
FIG. 1 is a diagrammatic block diagram of a semiconductor manufacture controller system in accordance with a prior art.
Figure 2:
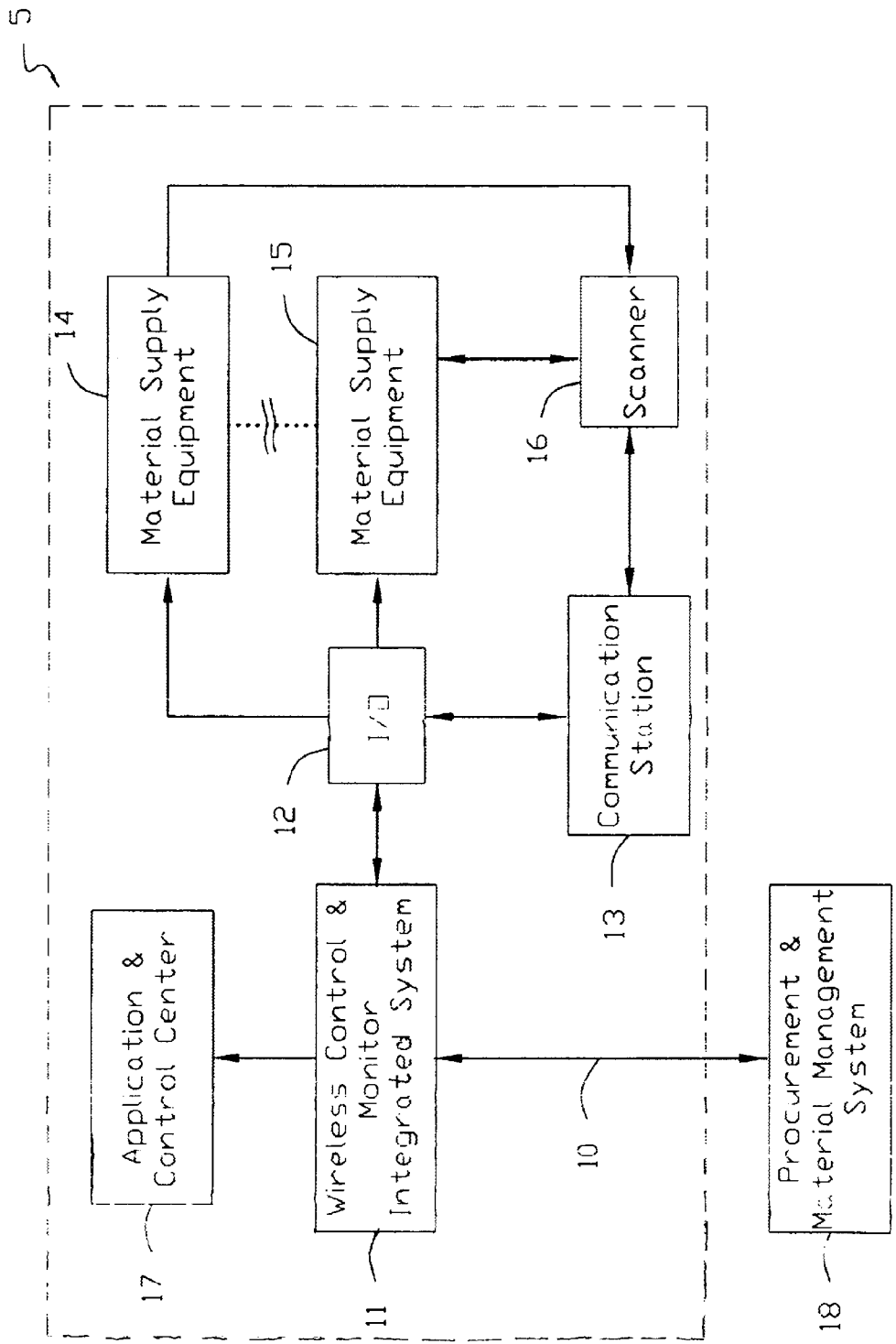
FIG. 2 is a diagrammatic block diagram of a semiconductor manufacture controller system in accordance with the present invention.

Referring to FIG. 2, a semiconductor material supply equipment management system 5 includes a wireless control and monitor integrated system 11, which is for example a standard personal computer. Software (not shown) within the wireless control and monitor integrated system 11 has a function of by-pass bar-code which allows the wireless control and monitor integrated system 11 to encode and decode information from bar-code. An input/output (I/O) device 12, for example a hub, is coupled to the wireless control and monitor integrated system 11 and multitude of material supply equipment 14 and 15. In the embodiment, the material supply equipment 14 and 15 is individual gas supply system and chemical supply system, which has individually material identification bar-code (not shown) stamped on. A communication station 13, for example a wireless base station, is coupled to the I/O device 12 through a local computer net 20, such as ethernet. A scanner 16, for example a bar-code scanner, can collect information of material identification bar-code from the material supply equipment 14 and 15 and wirelessly communicate with the communication station 13. Besides, an application and control center 17, for example a computer, is coupled to the wireless control and monitor integrated system 11, which allows outside users to monitor the material supply equipment system condition. Furthermore, the wireless control and monitor integrated system 11 also communicates with a procurement and material management system 18 through intranet 10.

Figure 3:
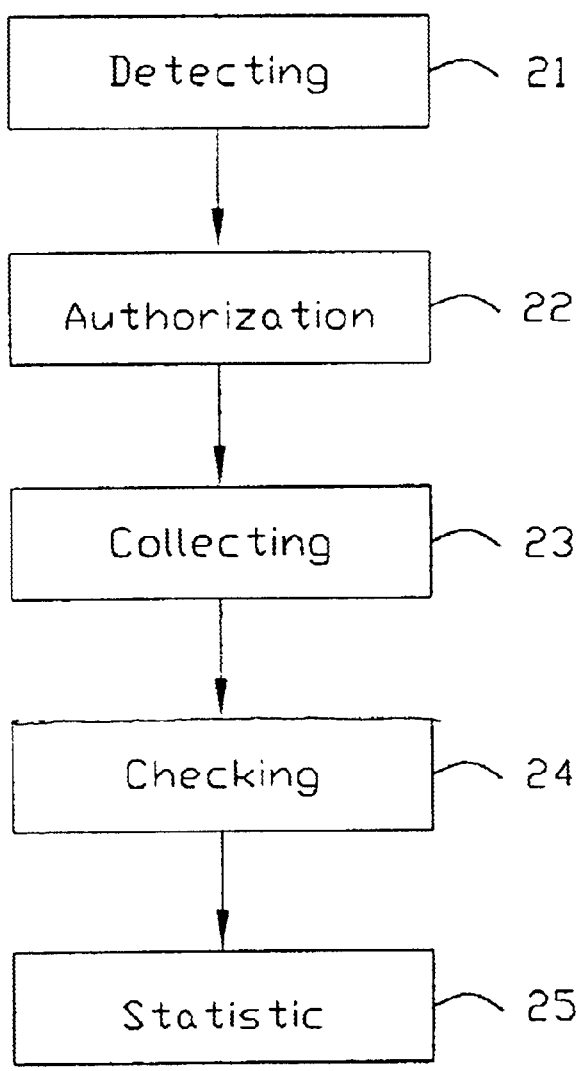
FIG. 3 is a flow chart illustrating interlocking management in accordance with the present invention.

During normal operation, the semiconductor manufacturing management system is configured to operate in the mode most suitable for the operation being performed. The change mode, such as changing exhausted gas cylinder in the material supply equipment, may be selected by user with the wireless control and monitor integrated system. The wireless control and monitor integrated system in the state of change mode can reminds user of executing scanning bar-code and automatically detect the scanning bar-code information coming (step 21), as shown in FIG. 3. Next, the user needs to input his or her identification into the scanner for a changing material authorization (step 22). Once the user is authorized, he or she can execute collecting information of changed material by scanning material identification bar-code with the scanner (step 23). The information including user's identification and changed material is transferred into the wireless control and monitor integrated system through the communication station and I/O device, and checked by the wireless control and monitor integrated system (step 24). The wireless control and monitor integrated system checks over the information from the scanner and then displays the change statistics (step 25). Following drawings illustrate the steps of FIG. 3 in detail.

Figure 4A:
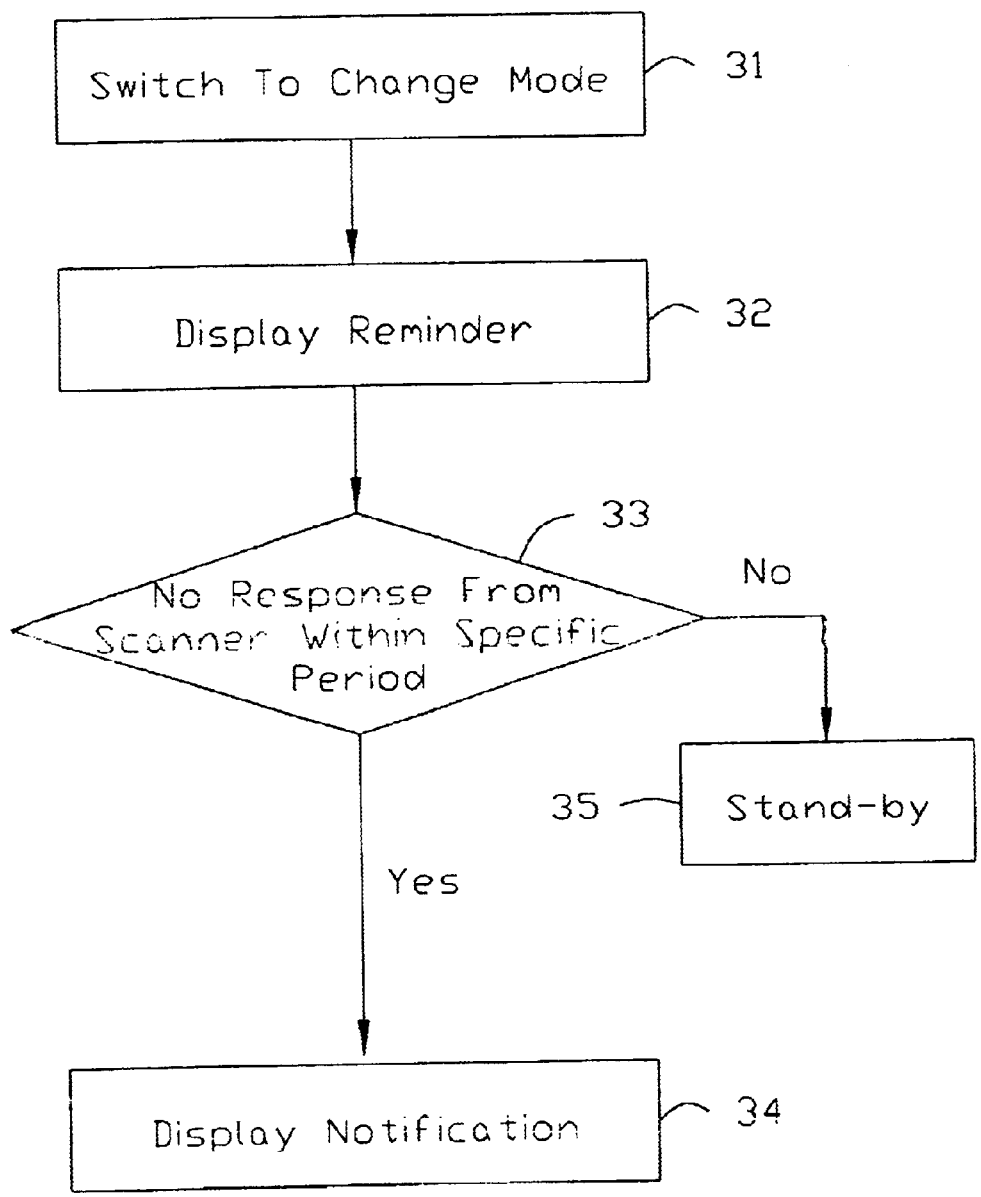
FIGS. 4A–4E are flow charts illustrating detailed interlocking management of FIG. 3 in accordance with the present invention.

FIG. 4A shows detailed flow of step 21 of FIG. 3. User selects a stop command in an operation menu for changing material and then the wireless control and monitor integrated system is switched to the change mode (step 31). The wireless control and monitor integrated system in the state of change mode first display a reminder on screen for user to execute scanning bar-code (step 32) and detect the signal coming from the scanner. Once the bar-code signal isn't transferred into the wireless control and monitor integrated system within a specific period (step 33), the wireless control and monitor integrated system can display a notification about timeout (step 34). Furthermore, the wireless control and monitor integrated system is in a state of stand-by mode in case of receiving the bar-code signal (step 35).

Figure 4B:
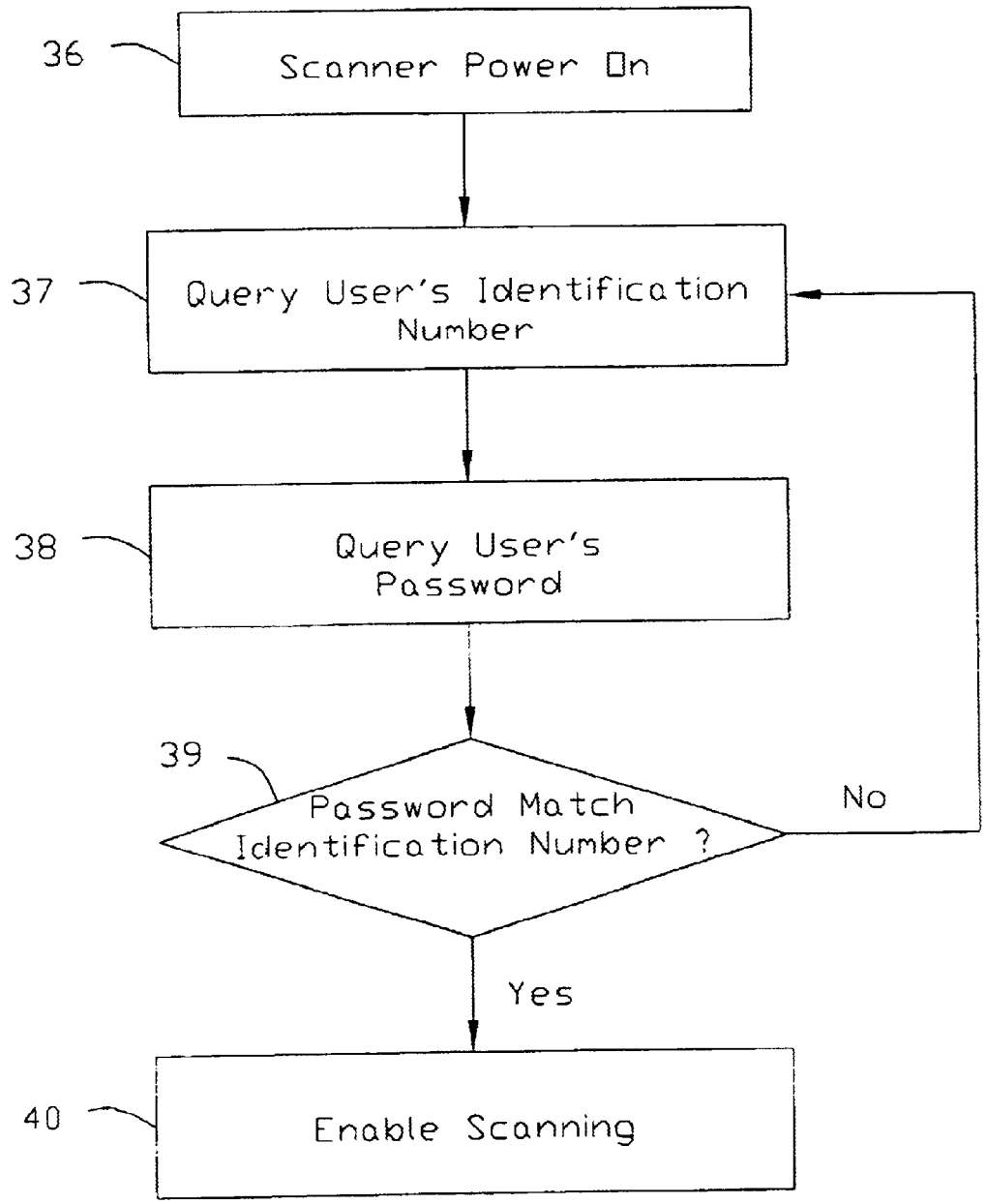

FIG. 4B shows detailed of step 22 of FIG. 3. User first turns the scanner power on (step 36) for executing scanning step. The scanner first queries the user about his or her identification number (step 37) for the sake of safety management. Next, user also needs to input his or her password for query from the scanner (step 38). Once the password and the identification number can match up (step 39), the scanner can switch to a mode of enabling scanning (step 40), otherwise it would go back prior querying step.

Figure 4C:
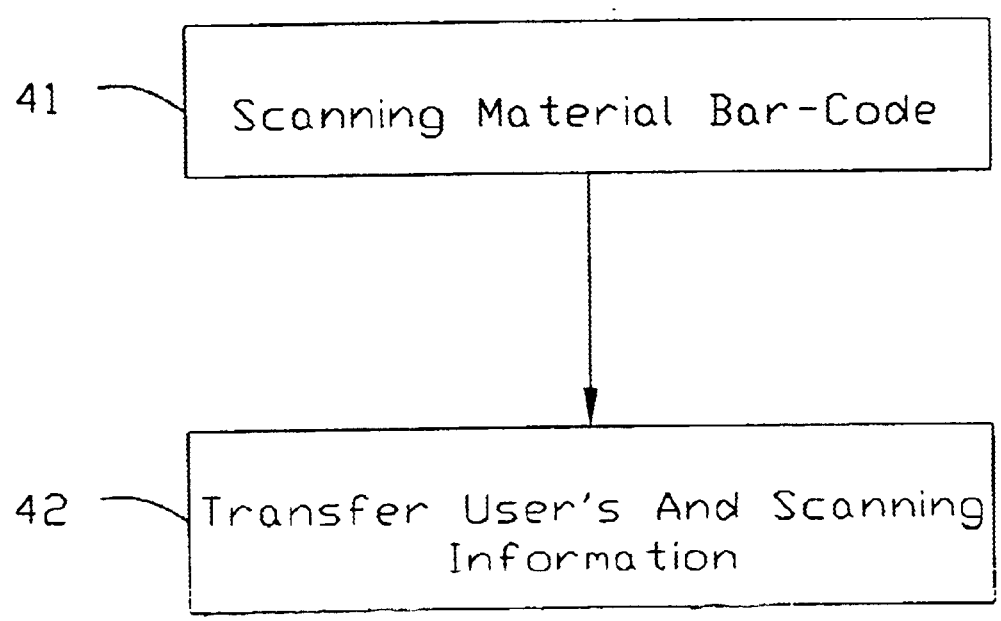

Details for step 23 of FIG. 3 is shown in FIG. 4C. User collects changed material information by scanning the material identification bar-code stamped on the material supply equipment with the scanner (step 41), and then transfer the information including user's and changed material information to the wireless control and monitor integrated system through the ethernet of the communication station and I/O device (step 42).

Figure 4D:
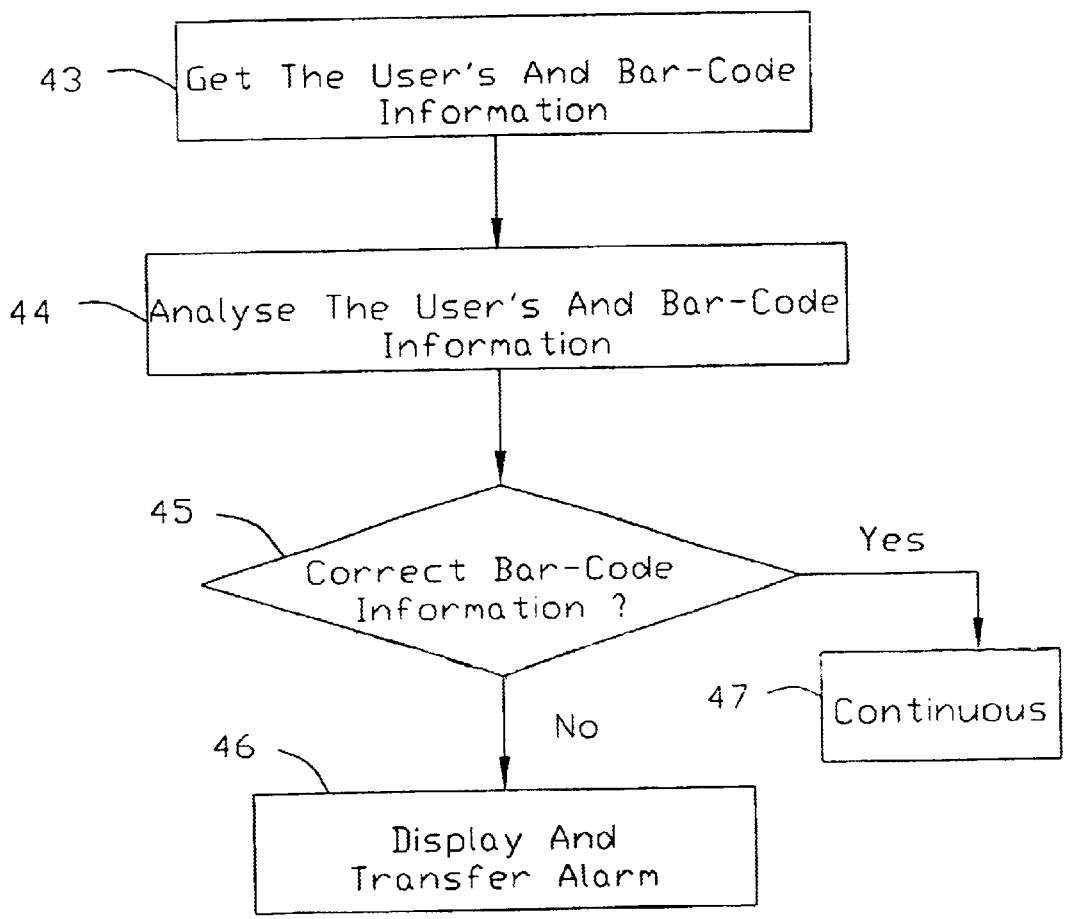

The checking step 24 of FIG. 3 is illustrated in detail in FIG. 4D. When the wireless control and monitor integrated system detects and receives the user and bar-code information (step 43), it can decode the user and bar-code information with the software having function of by-pass bar-code (step 44). Once the user and bar-code information is checked (step 45) and correct, it can be saved in the wireless control and monitor integrated system for use and the corresponding material supply equipment can be executed continuously (step 47). Otherwise, the abnormal state response and alarm can be displayed on the screen and transferred back to the corresponding material supply equipment (step 46). To be specific, the abnormal state response and alarm can be displayed on multitude of "terminals" including the application and control center, and the corresponding material supply equipment.

Figure 4E:
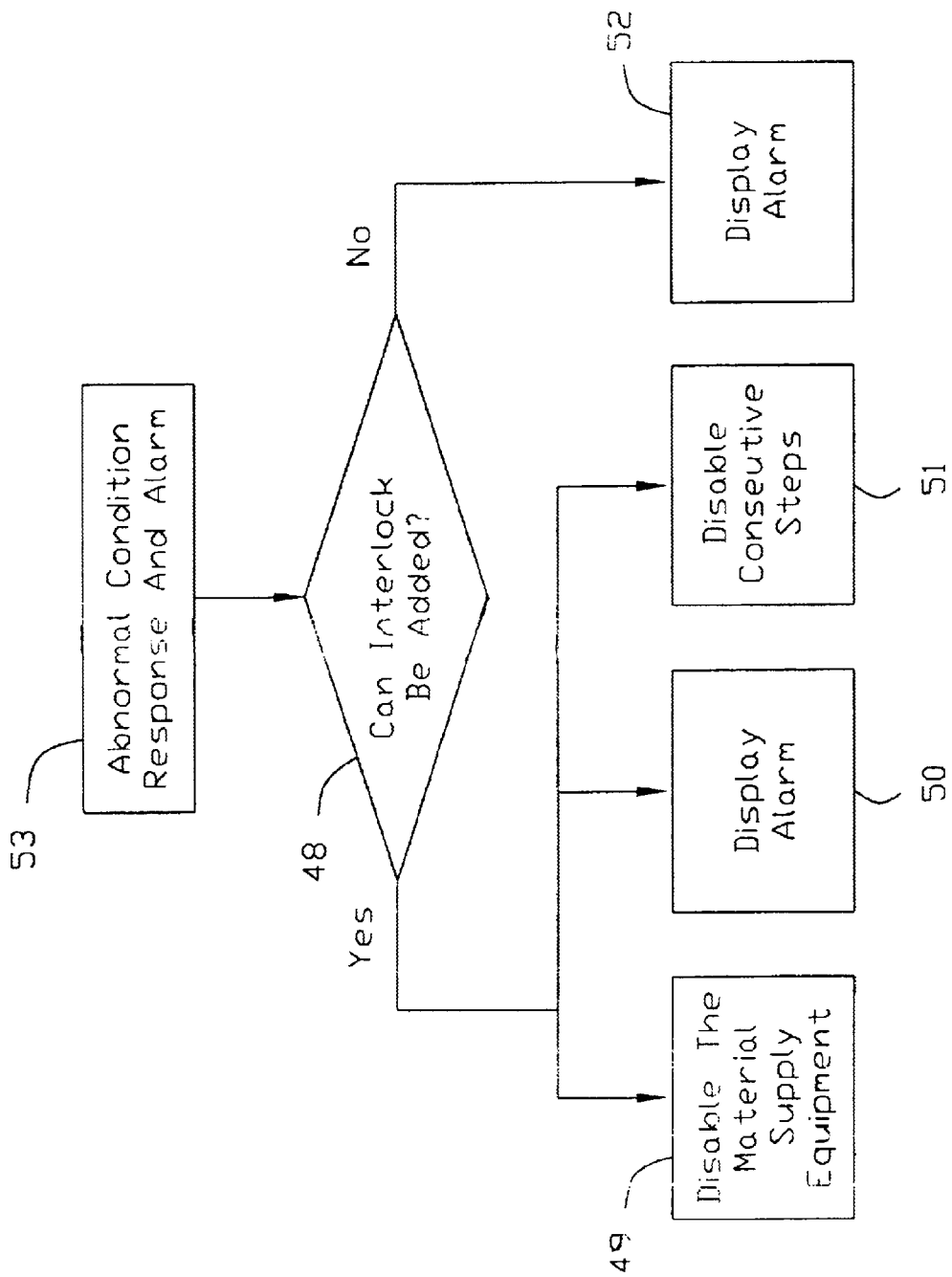

Depicted as FIG. 4E, as a key of the present invention, is detail of step 25 (statistics) in FIG. 3. The abnormal state response and alarm are sent from the wireless control and monitor integrated system (step 53). Next, For the corresponding material supply equipment capable of addition function of interlocking (step 48), the alarm can be used for directly disabling the material supply equipment itself (step 49), for example disabling a "confirm" button on the corresponding material supply equipment. On the other hand, the alarm can be displayed on the material supply equipment as well as the wireless control and monitor system, and the application and control center (step 50). The alarm mode can be audio-beeping or video-alarm message. Furthermore, the wireless control and monitor integrated system may disable the consecutive steps on the screen for the corresponding material supply equipment (step 51) and user can't run the abnormal material supply equipment. For the corresponding material supply equipment lack of addition function of interlock, the alarm may be displayed on the screen of the wireless control and monitor system, the application and control center, or the corresponding equipment material supply (step 52) without locking operation of the material supply equipment. The advantage of interlock can prevent the alarm message from neglect of treatment.

To be specific, in the present invention, the user and bar-code information may include the user's name, the name of changed material, the lot number of changed material, the production date of changed material and the deadline date of changed material. On the other hand, the information can be transferred to the application and control center as change statistics, and to the procurement and material management system through the intranet for comparison with procurement records. On the other hand, the communication between the wireless control and monitor integrated system and the procurement and material management system is through the intranet that is separated from the ethernet. Once the alarm message is transferred in the semiconductor material supply equipment management system, it can't be interrupted or slow down derived from the interior intranet of the company.

It is an object of the present invention to provide a system and method for the semiconductor material supply equipment management to reduce the abnormal condition derived from mistake of changed material and user's operation. There are many advantages of the present invention. First, the changed material record statistics including user and material information can be traced and compared with original procurement record statistics. Second, the consumption of changed material can be automatically registered and calculated in the inventory of the stock, that can cost down and reduce mistakes in the stock management. Third, the changed material information is collected by the scanner and checked by the wireless control and monitor integrated system can reduce accidental failure and further in time response abnormal change material. Furthermore, the following step of abnormal changed material condition can be immediately interrupted through interlocking in the semiconductor material supply equipment management system, so that can prevent more serious consequent condition happening.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. Apparatus for interlocking material supply equipment in semiconductor manufacture system, said apparatus comprising:

a wireless controller used for treatment of bar-code information and comprising software having a function of by-pass bar-code;

a bar-code scanner communicating with said wireless controller through a transmission system, said bar-code scanner for collecting said bar-code information of said material supply equipment; and a plurality of alarm devices coupled to a plurality of material supply equipment and said wireless controller, said alarm devices receiving a plurality of alarm message from said wireless controller.

2. The apparatus of claim 1, wherein said treatment of said controller comprises:

receiving said bar-code information from said bar-code scanner through said transmission system;

checking said bar-code information;

transferring said alarm message into said alarm devices; and disabling said corresponding material supply equipment according to said alarm message.

3. The apparatus of claim 1, wherein said treatment further comprises displaying said alarm message on a display screen of said controller and disabling a plurality of consequent steps corresponding said material supply equipment on said display screen.

4. The apparatus of claim 1, wherein said transmission system comprises a wireless communication station and an input/output device.

5. The apparatus of claim 4, wherein said wireless communication station is coupled to said input/out device with a local network.

6. The apparatus of claim 4, wherein said input/output device is a hub.

7. A system for interlocking material supply equipment in semiconductor manufacture system, said system comprising:

collecting means for collecting a user's and material information, wherein said material information is stored in a bar-code stamped on material supply equipment, and said bar-code comprises a material name, a material lot number, a material quantity, and a material identification;

communication means for transferring said user's and said material information;

a wireless controller communicated with said material supply equipment and said collecting means through said communication means, said wireless controller for sending out a plurality of alarm message, wherein said material identification is configured for checking said wireless controller; and alarm means coupled to said material supply equipment and communicated with said wireless controller through said communication means, said alarm means for displaying said alarm message and controlling said material supply equipment.

8. The system of claim 7, wherein said collecting means comprises a bar-code scanner.

9. The system of claim 8, wherein said user's information is inputted into said bar-code scanner by an input device of said bar-code scanner.

10. The system of claim 7, wherein each said material information is stored in a bar-code stamped on said each material supply equipment.

11. The system of claim 7, wherein said communication means comprises a wireless communication station and an input/output device.

12. The system of claim 7, wherein said controller comprises communicating with a plurality of exterior controllers.

13. The system of claim 7, wherein said controller is used for treatment of said user's and said material information, and said treatment comprises:

receiving said user's and said material information from said collecting means through said communication means;

checking said user's and said material information;

transferring said alarm message into said alarm means; and disabling said material supply equipment according to said alarm message.

14. The system of claim 13, wherein said controller further comprises displaying said alarm message, said user's and material information on a display screen of said controller and disabling a plurality of consequent steps for said corresponding material supply equipment on said display screen.

15. The system of claim 7, wherein said alarm means comprises an alarm button coupled to a controlling device of said material supply equipment, and said alarm button can disable said controlling device according to said alarm message.

16. A method for interlock managing change materials of material supply equipment in semiconductor manufacture system, said method comprising:

collecting changed material information of said material supply equipment;

checking said changed material information by a wireless controller communicated with said material supply equipment, wherein said checking step comprises comparing said changed information with a database of said wireless controller;

sending out an alarm message to said material supply equipment from said wireless controller; and disabling said corresponding material supply equipment according to said alarm message.

17. The method according to claim 16 further comprising:

authorizing a user to collect said changed material information;

transferring said changed material information to said controller through a wireless communication station and a local network; and displaying said changed material information and said alarm message on a screen of said controller.

18. The method according to claim 16, wherein said disabling step comprises disabling a plurality of consequent steps of said corresponding material supply equipment shown on a display screen of said controller.

19. The method according to claim 16, wherein said collecting step is accomplished with a bar-code scanner.

20. The method according to claim 16 wherein said changed material information comprises a user's identification.

21. The method according to claim 16 wherein said changed material information comprises a lot number and a name of said changed material stored in a bar-code.

22. Apparatus for interlocking material supply equipment in semiconductor manufacture system, said apparatus comprising:

a wireless controller used for treatment of bar-code information, wherein said bar-code information comprises a material name, a material lot number, a quantity of said material, and an identification of said equipment material for checking of said wireless controller;

a bar-code scanner communicating with said wireless controller through a transmission system, said bar-code scanner for collecting said bar-code information of said material supply equipment; and a plurality of alarm devices coupled to a plurality of material supply equipment and said wireless controller, said alarm devices receiving a plurality of alarm message from said wireless controller.

* * * * *